United States Patent [19]

Namose

[11] Patent Number: 5,348,910
[45] Date of Patent: Sep. 20, 1994

[54] METHOD OF MANUFACTURING A SEMICONDUCTOR DEVICE AND THE PRODUCT THEREBY

[75] Inventor: Isamu Namose, Suwa, Japan

[73] Assignee: Seiko Epson Corporation, Tokyo, Japan

[21] Appl. No.: 994,312

[22] Filed: Dec. 21, 1992

[30] Foreign Application Priority Data

Dec. 24, 1991 [JP] Japan .................................. 3-341339
Nov. 11, 1992 [JP] Japan .................................. 4-326136

[51] Int. Cl.$^5$ ........................................... H01L 21/76
[52] U.S. Cl. .................................... 437/70; 437/69; 437/26; 437/45; 437/913
[58] Field of Search ................. 437/70, 26, 69, 45, 437/913

[56] References Cited

U.S. PATENT DOCUMENTS

| | | | |
|---|---|---|---|
| 4,277,882 | 7/1981 | Crossley | 437/70 |
| 4,373,965 | 2/1983 | Smigelski | 437/70 |
| 4,577,394 | 3/1986 | Peel | 437/70 |
| 4,743,566 | 5/1988 | Bastiaens et al. | 437/70 |
| 4,829,019 | 5/1989 | Mitchell et al. | 437/70 |

FOREIGN PATENT DOCUMENTS

| | | | |
|---|---|---|---|
| 0050634 | 4/1980 | Japan | 437/70 |
| 0143047 | 11/1980 | Japan | 437/70 |
| 0065445 | 4/1984 | Japan | 437/70 |

Primary Examiner—Tom Thomas
Assistant Examiner—Trung Dang
Attorney, Agent, or Firm—Oliff & Berridge

[57] ABSTRACT

The present invention relates to a semiconductor device and a method for manufacturing the same comprising the steps of: forming an oxidation layer on the semiconductor substrate having a predetermined conductivity; introducing impurities having the same conductivity as that of the semiconductor substrate into the semiconductor substrate; forming an anti-oxidation layer on said oxidation layer; removing an arbitrary portion of said anti-oxidation layer; growing the oxidation layer by thermally oxidizing the semiconductor substrate to form the device isolation layer; and removing said anti-oxidation layer. Since the impurities are introduced into the region ranging from the device region to the device isolation region before the anti-oxidation layer is formed, the profile of the impurity concentration distribution in the boundary region between the device region and the device isolation region is smooth. Accordingly it is possible, for example, to prevent narrow channel effects of a transistor and to remove a bird's beak region simply.

18 Claims, 13 Drawing Sheets

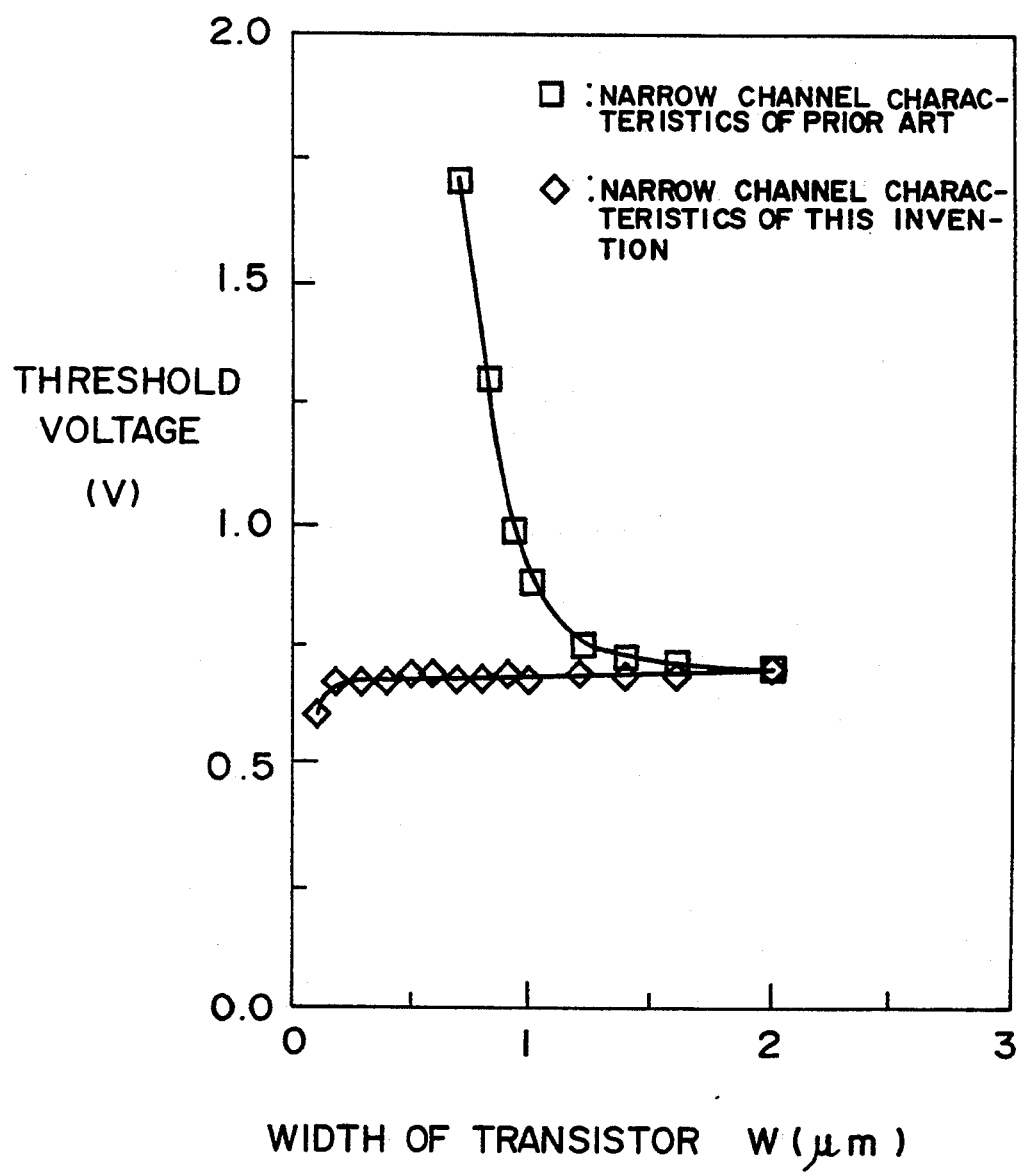

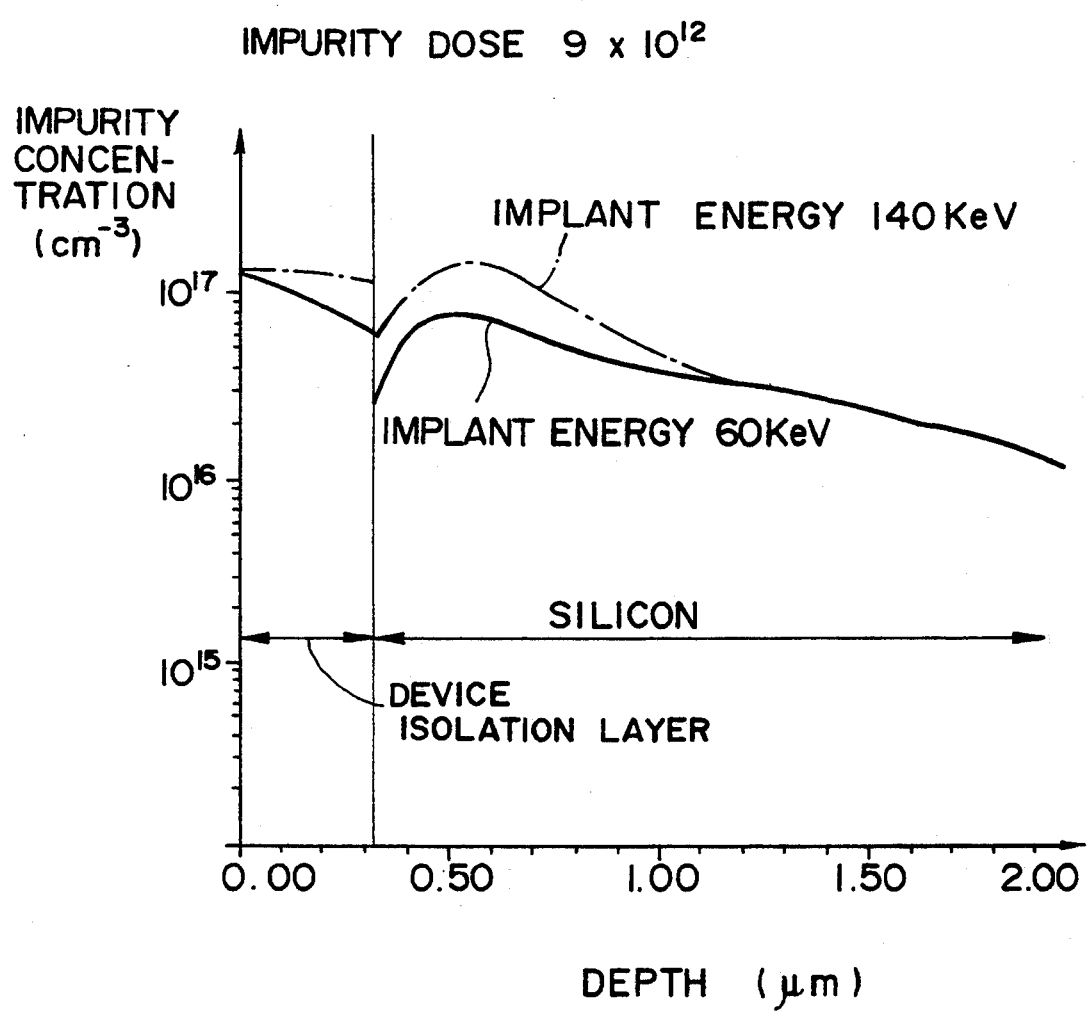

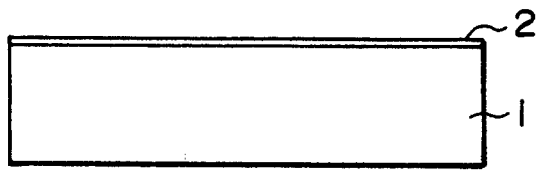
FIG.11a
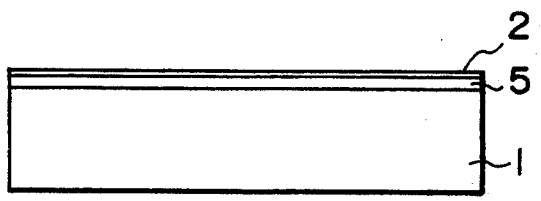
FIG.11b
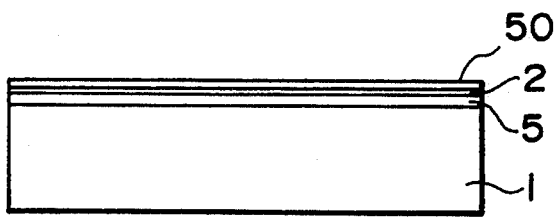
FIG.11b2
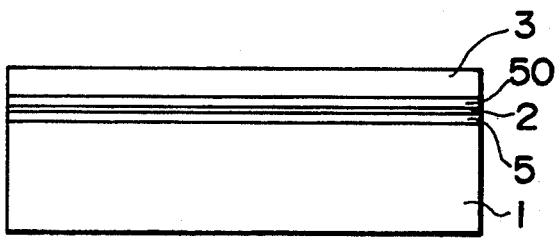
FIG.11c
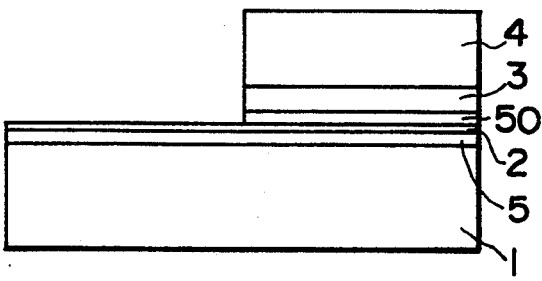
FIG.11d

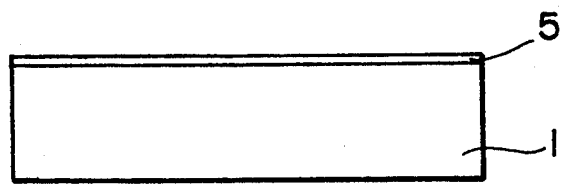
FIG. 12a
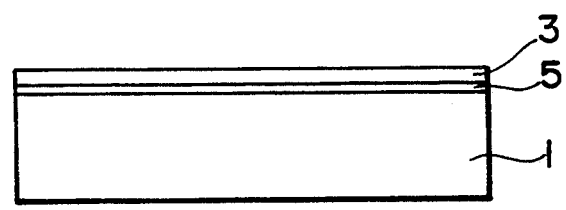
FIG. 12b
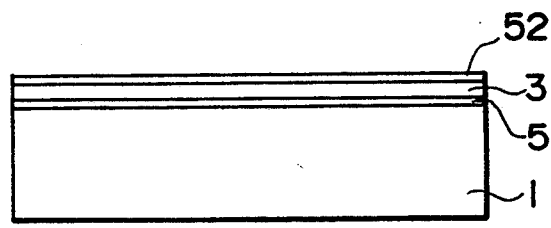
FIG. 12c
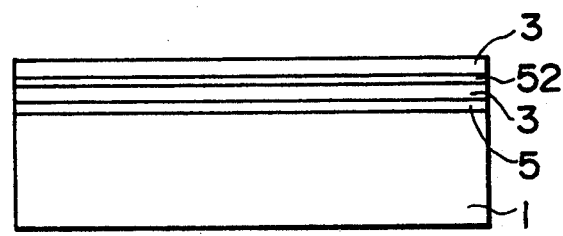
FIG. 12c2
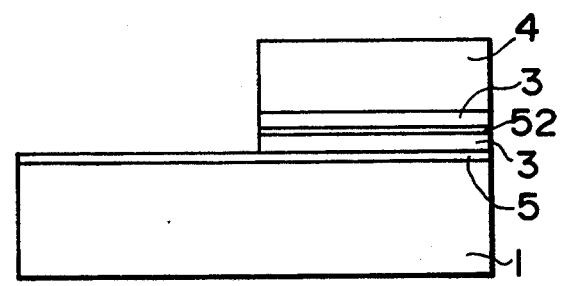
FIG. 12d
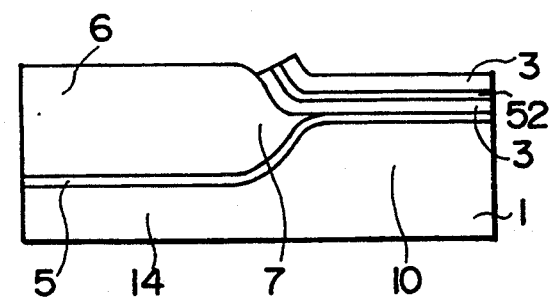
FIG. 12e

METHOD OF MANUFACTURING A SEMICONDUCTOR DEVICE AND THE PRODUCT THEREBY

BACKGROUND OF THE INVENTION

1. Field of the Invention

The present invention relates to a semiconductor device and a method for making the same, and more particularly to isolate a device region and device isolation region by forming a device isolation layer on a semiconductor substrate.

2. Description of the Related Art

Conventionally, a device isolation method known as selective oxidation has been employed to provide the electrical isolation necessary between the various device elements within the semiconductor integrated circuits.

The following is one well known example of a device isolation method employing the conventional art of selective oxidation. Firstly, oxidation and anti-oxidation layers are formed on the semiconductor substrate. Then, this anti-oxidation layer is selectively etched. Next, impurity doping known as the channel stopper is applied to this etched area in order to control the parasitic threshold voltage which will occur in the device isolation region. After this, the device isolation layer is formed by thermal oxidation, and in this way electrical isolation between the various device elements is achieved.

A detailed explanation of the above selective oxidation method for device isolation is given by FIG. 13. This processes involved in this device isolation method employing the conventional art of selective oxidation are described below.

(a) A thin oxidation layer 2 is formed on the semiconductor substrate 1.

(b) Next, an anti-oxidation layer 3 made from silicon nitride is deposited on the oxidation layer 2 by a process such as chemical vapor deposition (CVD).

(c) After this, an arbitrary portion of the anti-oxidation layer 3 is masked with a photoresist mask 4, and the region of the anti-oxidation layer which is not covered by the mask is removed by dry etching.

(d) Then, some impurities 5 having the same polarity as the semiconductor substrate are introduced via ion implantation.

(e) After this, isolation between the device region 10 and the device isolation region 14 is attained by growing a device isolation layer 6 on the semiconductor substrate through thermal oxidation.

(f) Lastly, the remainder of the anti-oxidation layer is removed.

(g) If a transistor region is formed in the device element region 10, some channel doping impurities 9 are implanted in order to control the threshold voltage for the transistor region, after which a gate 8 is formed.

Now, when the above method of formation of the device isolation layer is employed, regions known as bird's beak regions are formed at both ends of the device isolation layer as shown in FIG. 13. Also, there is an imbalance in the impurity concentration distribution for the border region 12 between the device region 10 and the device isolation region 14. Consequently, generation of bird's beak region 7 and occurrence of the imbalance of the impurity concentration distribution in the border region 12 are the source of the following problems.

(1) The first problem is that the bird's beak region 7 prevents the fine pattern process with the reason as follows.

Usually, the device isolation performance of the device isolation region 14 will improve if the parasitic threshold voltage of that region is increased. In order to increase the parasitic threshold voltage, the impurity concentration of the device isolation region 14 should be increased or the device isolation layer 6 should be made thick. However, as shown in FIG. 13, the device isolation layer 6 at the bird's beak region 7 is thin, so the parasitic threshold voltage at the bird's beak region 7 cannot be sufficiently increased. The device isolation region 14 can therefore not function effectively. The result of this is that the minimum pitch between elements is lengthened by the length of the bird's beak region 7, which is a major obstruction to the fine pattern process.

In particular, in case of LSI or ULSI such as DRAM, SRAM and DSP, reducing the minimum pitch between elements is a general way to get high degree of integration. This means that there are problems, namely, if the minimum pitch between elements is lengthened by the length of the bird's beak region 7, the area of LSI or ULSI will increase by a factor of two. This will increase the device cost and reduce the production yield.

It is well known that, for example, by increasing the ratio between the thicknesses of the anti-oxidation layer 3 and the thin oxidation layer 2, the area of the bird's beak region 7 can be reduced. This produces a new problem such that the stress generated during the growth of the oxidation layer 2 causes crystal defects in the substrate. In addition to this method, there is another high precision engineering method known as the shallow trench isolation. However, this method has many problems because this manufacturing process involves a large number of separate steps and the contents of these steps are quite complicated.

(2) The second problem is that imbalances in the impurity concentration distribution in border region 12 are detrimental to the characteristics of the device. Detriments such as narrow channel effects can be seen in the device characteristics. Moreover, phenomena such as the increase of a leakage current and the reduction of the breakdown voltage in the border region 12 can then be observed. The causes of these phenomena are as follows.

In the conventional method, the photoresist 4 and anti-oxidation layer 3 prevent the impurities 5 to be used as the channel stopper 5 for the device isolation from being introduced into the device region 10. As a result of this, there is an imbalance in the impurity concentration distribution in the border region 12 between the device region 10 and the device isolation region 14 because the impurities 5 are introduced only into the device isolation region 14. In particular, the bird's beak region 7 absorbs fewer impurities because the device isolation layer 6 is thin. This means that more impurities remain in the region below the bird's beak region 7. So the imbalance in the impurity concentration distribution is more aggravated by this. Resultingly, during the thermal oxidation process or the like, some of the remaining impurities may diffuse their way into the device region 10.

If the device region 10 is formed as a transistor region, this diffusion of impurities into the device region 10 profoundly affects the characteristics of the transistor. That is, because an inversion region is hard to be formed in the device region 10 due to the diffused impurities, the transistor threshold voltage is increased. When the transistor width W is narrower, this tendency becomes more noticeable and a phenomenon known as narrow channel effects as shown in FIG. 5 is produced.

Additionally, if the device region 10 is formed as an active region made of impurities which has a polarity opposite to that of the substrate, the following problems will occur. There will be an imbalance in the impurity concentration distribution of the border region 12 and the breakdown voltage in this region will become low. Also, impurities of an another polarity will diffuse into the active region and a leakage current for this region will increase. There will be detrimental effects towards, for example, the device reliability and the product yield.

SUMMARY OF THE INVENTION

The present invention sets out to solve the problems described above by removing the imbalances in the impurity concentration distribution in the device isolation border region and more particularly by preventing the impurities under the bird's beak region 7 from diffusing into the device region. In doing this a more reliable semiconductor device with the fine pattern process and the method for making the same can be provided.

A further objective of the present invention is to provide a semiconductor device and the method for making the same wherein the bird's beak region formed within the device isolation layer is reduced without any negative effects on other device characteristics.

According to the first aspect of the invention, there is provided a method of manufacturing a semiconductor device wherein a device isolation layer is formed on a semiconductor substrate to isolate a device region and a device isolation region from one another, the method comprising the steps of:

(a) forming an oxidation layer on the semiconductor substrate having a predetermined polarity;

(b) introducing impurities having the same polarity as that of the semiconductor substrate into the semiconductor substrate;

(c) forming an anti-oxidation layer on the oxidation layer;

(d) removing an arbitrary portion of the anti-oxidation layer;

(e) growing the oxidation layer by thermally oxidizing the semiconductor substrate to form the device isolation layer; and (f) removing the anti-oxidation layer.

According to the method for manufacturing a semiconductor device in the present invention, the implantation of the impurities to be used as the channel stopper is carried out before the step (c), the process to form the anti-oxidation layer. It follows that said impurities are introduced into a region ranging from the device region to the device isolation region. Consequently, there is no imbalance in the profile of the impurity concentration distribution in the device isolation border region. In particular, the peak in the profile of the impurity concentration distribution in the region below the bird's beak region does not occur. Therefore, impurities under the bird's beak region do not diffuse into the device region during the formation of the device isolation layer by thermal oxidation in step (e). This means that the impurities are effectively prevented from doing bad influences such as an occurrence of narrow channel effects, a generation of a leakage current and a drop of a breakdown voltage on the device such as a transistor and an active region.

Furthermore, in the present invention, because the impurities under the bird's beak region do not diffuse, the impurity concentration in the device isolation region can be increased enough to narrow the width of the device isolation region. This in turn means that integration density of LSI can be greatly improved.

If the additional step (g) wherein the bird's beak region is reduced is added after step (f), the fine pattern process is achieved. In particular, because there is no peak in the profile of the impurity concentration distribution of the region under the bird's beak region, even if the region under the bird's beak region is exposed after reducing of the bird's beak region, detrimental phenomena such as the promotion of narrow channel effects do not occur. Reducing of the bird's beak region which was substantially impossible in the conventional art, is now a possibility in the present invention. This means that the fine pattern process can be achieved.

The manufacturing method may further comprise the step (h) wherein a transistor region is formed by providing a gate in the device region after step (f) or the step (g) to use the impurities introduced in step (b) also as the impurities for channel doping in order to control the threshold voltage in the transistor region. Then, the processes which were necessary in the conventional art for the implantation of the impurities which control the threshold voltage in the transistor region can now be omitted. As doing this reduces the number of steps in the method by two steps at least, the manufacturing costs can be reduced and the product yield can be greatly improved.

If the implant energy for the impurities in the step (b) is increased as the thickness of the device isolation layer formed in the step (e), it is possible to control suitably the profile of the impurity concentration distribution in the device region and the device isolation region.

Under usual circumstances, in order to increase the device isolation performance of the device isolation region, it is necessary to increase the thickness of the device isolation layer. However, if the thickness of the device isolation layer is increased, a larger amount of the impurities are absorbed by the device isolation layer during the formation of the device isolation layer. This in turn lowers the impurity concentration in the device isolation region. The lowering of the impurity concentration cancels out the advantage of increases in the device isolation performance of the device isolation region which may have been made by increasing the thickness of the device isolation layer. In order to cope with this situation, the present invention is constructed in such a way that the impurity implant energy increases in accordance with increases of the thickness of the device isolation layer. In this way the peak in the profile of impurity concentration distribution can be placed at a greater depth. This means that the amount of impurities which is to be absorbed by the device isolation layer during its formation by thermal oxidation can be reduced and that the device isolation performance of the device region can be suitably adjusted.

Particularly, in the conventional art, the device region is masked by an anti-oxidation layer to prevent the impurities as a channel stopper from diffusing to the device region. If the implant energy is too high, for example, 40 KeV, impurities penetrate the anti-oxidation layer. As a result, it is impossible to control the impurity concentration at the device isolation region by the impurity implant energy in the conventional art.

The present invention can control the impurity concentration in the device isolation region by the impurity implant energy, even by the energy of 40 KeV or more, whereby it is difficult to control the impurity concentration in the conventional art.

Furthermore, in the present invention, it is possible to control the impurity concentration in the device region in the same way as the impurity concentration in the device isolation region. For example, if a transistor is formed at the device region, it is possible to decrease the transistor threshold voltage in the transistor by increasing the impurity implant energy. By increasing implant energy, it is possible to keep process fluctuations in the impurity concentration occurring in the transistor region low. As this means that fluctuations in the transistor threshold voltage can also be kept low, the precess yield can be greatly improved.

The step of forming a polysilicon layer can be inserted between the impurity implant step (b) and the anti-oxidation layer forming step (c). As a result of this, most of the stress on the semiconductor substrate by the formation of the device isolation layer can be turned to the polysilicon layer. Therefore, the thickness ratio can be set to levels which are previously impossible in the conventional art and the bird's beak region 7 can be reduced.

Alternatively, instead of having the oxidation layer forming step (a), the first anti-oxidation layer can be formed directly onto the semiconductor substrate. An oxidation layer can then be formed on top of the first anti-oxidation layer, with the second anti-oxidation layer in turn being formed on this oxidation layer. I this way, a device having a construction wherein an oxidation layer is sandwiched between the first and the second anti-oxidation layers directly on the semiconductor substrate is acquired. With this construction, the bird's beak region can be effectively reduced, and most of the stress generated in the first and the second anti-oxidation layers can be turned to the oxidation layer sandwiched between anti-oxidation layers. In this way, device reliability can be greatly improved.

According to the second aspect of the invention, there is provided a semiconductor device formed by introducing into a semiconductor substrate impurities having the same polarity as that of the semiconductor substrate and by forming a device isolation layer on the semiconductor substrate to isolate a device region and a device isolation region from one another, wherein the profile of the impurity concentration distribution in a region ranging from the device region to the device isolation region varies continuously, and the impurity concentration in a border region between the device region and the device isolation region is within a range between the impurity concentration in the device region and that in the device isolation region.

In other words, the profile of the impurity concentration distribution in a region ranging from the device region to the device isolation region varies continuously, and the profile of the impurity concentration distribution in a border region between the device region and the device isolation region is free of any peak.

Therefore, the impurities diffused into the device region by the thermal diffusion or the like can be effectively prevented from doing bad influence on the device elements such as a transistor and an active region. If the device region is a transistor region, narrow channel effects generated on the transistor can effectively prevented. This will greatly improve the fine pattern process and reliability of the process. Also, if the device region is an active region, the generation of leakage current and a drop of breakdown voltage in the border region can be effectively prevented.

Because the semiconductor device in the present invention does not have the peak and the impurity imbalance in the profile of the impurity concentration distribution, there are some merits as follows when the semiconductor has the bird's beak region at the border region. Even if the area underneath the bird's beak region becomes after removal of all or a part of the bird's beak region exposed, problems detrimental to the device characteristics such as narrow channel effects do not occur. It follows that as the removal of the bird's beak region which is substantially impossible in the prior art can now be done, the fine pattern process can be greatly improved upon.

Moreover, if the device region is used as a transistor region, the impurities introduced into the device region may be used also for the purpose of controlling the threshold voltage of the transistor.

A peak of the profile of the impurity concentration distribution in the direction of depth of the semiconductor substrate may be located in a deeper position as the thickness of the device isolation layer is increased. An optimal profile of the impurity concentration distribution for the device region and the device isolation region can thus be obtained.

According to the semiconductor device in the present invention, if the device isolation layer is made thick, the peak of the profile of the concentration distribution is set to be at a deeper position. By doing this, the amount of impurities absorbed by the device isolation layer during thermal oxidation or the like can be reduced. In this way, a drop of the impurity concentration in the device isolation region can be avoided, and the device isolation performance of the device isolation region can be appropriately adjusted. It is now possible to have a form of control whereby the impurity concentration in the device isolation region can be varied by varying the depth of the peak of the impurity concentration distribution according to the device isolation layer thickness. This kind of control was practically very difficult when the conventional semiconductor device structure is used.

Also, with a conventional semiconductor device structure, an impurity concentration at the boundary of the device isolation layer in the device isolation region of greater than $1 \times 10^{16}(cm^{-3})$ is very difficult. However, in the present invention, it becomes possible to make the impurity concentration at the boundary of the device isolation layer in the device isolation region higher than $1 \times 10^{16}(cm^{-3})$, and thus a high device isolation performance is achieved.

Moreover, according to the device in the present invention, the impurity concentration in the device region can also be controlled. Namely, if a transistor is formed at the device region, the transistor threshold voltage can be controlled by varying the position of the peak of the profile of impurity concentration distribution. By keeping the position of the peak at a greater depth, process fluctuations in the threshold voltage can be kept low, thus resulting in a greater product yield.

BRIEF DESCRIPTION OF THE DRAWINGS

FIG. 5 is a graph comparing the characteristics of narrow channel transistors for the present invention with those of the conventional art;

FIG. 9 is a characteristic curve showing the variation of the profile of the impurity concentration distribution in the direction of the depth of the substrate as the impurity implant energy is varied;

FIGS. 11a–11d and 11b2 are cross-sectional views showing the process of forming a polysilicon layer on the oxidation layer for a second embodiment of the present invention;

FIGS. 12a–12e and 12c2 are cross-sectional views showing the process of sandwiching an oxidation layer between two anti-oxide layers for a third embodiment of the present invention.

DETAILED DESCRIPTION

First Embodiment (1) Manufacturing Process

FIGS. 1a–1f are cross-sectional views showing the manufacturing process for a first embodiment of the present invention.

Figure 1A:
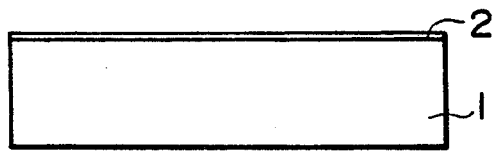
FIGS. 1a–1f are cross-sectional views showing an embodiment of the manufacturing method of the semiconductor device of this invention.

As shown in FIG. 1a, a silicon oxidation layer 2 having a thickness of 150 Angstroms is formed on the semiconductor substrate 1 via thermal oxidation. Although a thickness of 150 Angstroms has been selected for the purposes of this example, this is by no means fixed, and by the fine tuning of various conditions, it may be possible to find a more suitable value.

Figure 1B:
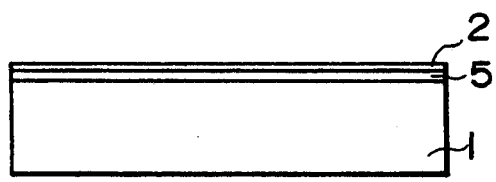

Next, as shown in FIG. 1b, impurities 5 having the same polarity as the substrate 1 are implanted in the semiconductor substrate 1 by a process such as ion implantation. For this example a P-type substrate has been chosen so an impurity of the same polarity such as boron can be used.

Therefore, the amount of implant energy and quantity of dose of the impurities to be ion implanted can be decided, as mentioned above, based on the transistor threshold voltage, a thickness of the device isolation layer and the required device isolation performance and the like. When the device region is the transistor region, the introduced impurities can also be used for channel doping to control the transistor threshold voltage.

Figure 1C:
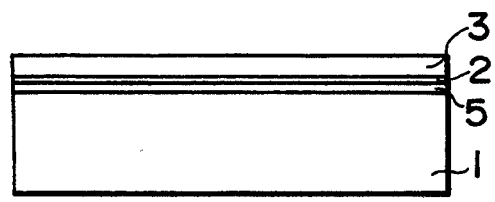

Next, as shown in FIG. 1c, and anti-oxidation layer 3 made of, for example, silicon nitride and having a thickness of, for example, 1800 Angstroms is formed by CVD or the like. Although for the purposes of this example a silicon nitride having a thickness of 1800 Angstroms has been chosen, this is by no means fixed, and by taking into account various process conditions, a more desired value can be selected. More particularly, based on the thickness of the anti-oxidation layer 3 and the thickness of the oxidation layer 2, the length of the bird's beak region 7 is decided. It therefore follows that the thickness of the anti-oxidation layer 3 and the thickness of the oxidation layer 2 should be adjusted to give a bird's beak region within the desired thickness.

Figure 1D:
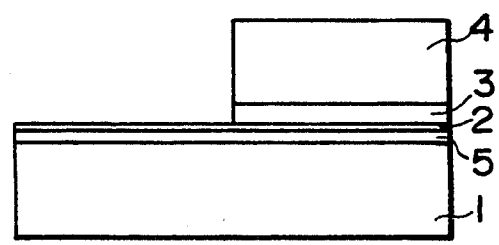

Then, as shown in FIG. 1d, by using standard photolithographic methods, an arbitrary portion of the anti-oxidation layer 3 is covered with a mask of photoresist 4, and the remaining region of the anti-oxidation layer 3 which is not covered by the mask is then removed by dry etching.

Figure 1E:
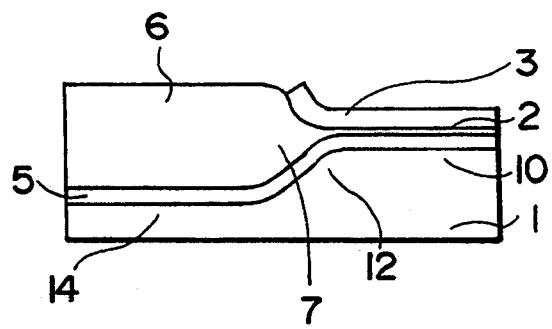

After this, as shown in FIG. 1e, a device isolation layer 6 is oxidized and grown to a thickness of, for example, 6000 Angstroms at a temperature of, for example, 1050° C. in an atmosphere of, for example, wet oxidation. The temperature at this time and the thickness are not fixed, and the amount of oxidation necessary in order to form the device isolation layer should be selected.

Figure 1F:
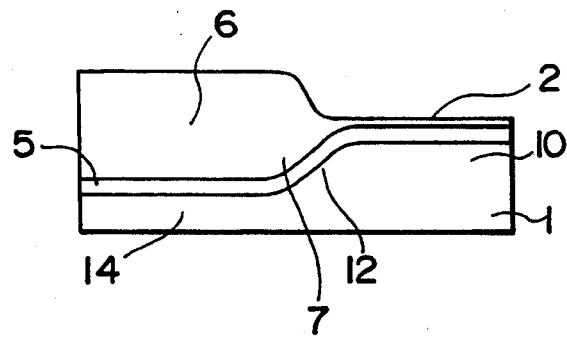

Lastly, as shown in FIG. 1f, the remainder of the antioxidation layer 3 is removed.

(2) Profile of Impurity Concentration Distribution

In the above manufacturing process for a semiconductor device, with process (c), impurities 5 to be used as a channel stopper are introduced before step (c), the formation of the anti-oxide layer 3. It follows that the aforementioned impurities 5 are introduced into a region ranging from the device region 10 to the device isolation region 14. As a result of this, there is no imbalance in the profile of the impurity concentration distribution at the border area 12. In particular, no peak is formed in the profile of the impurity concentration distribution of the region below the bird's beak region 7.

Figure 6:
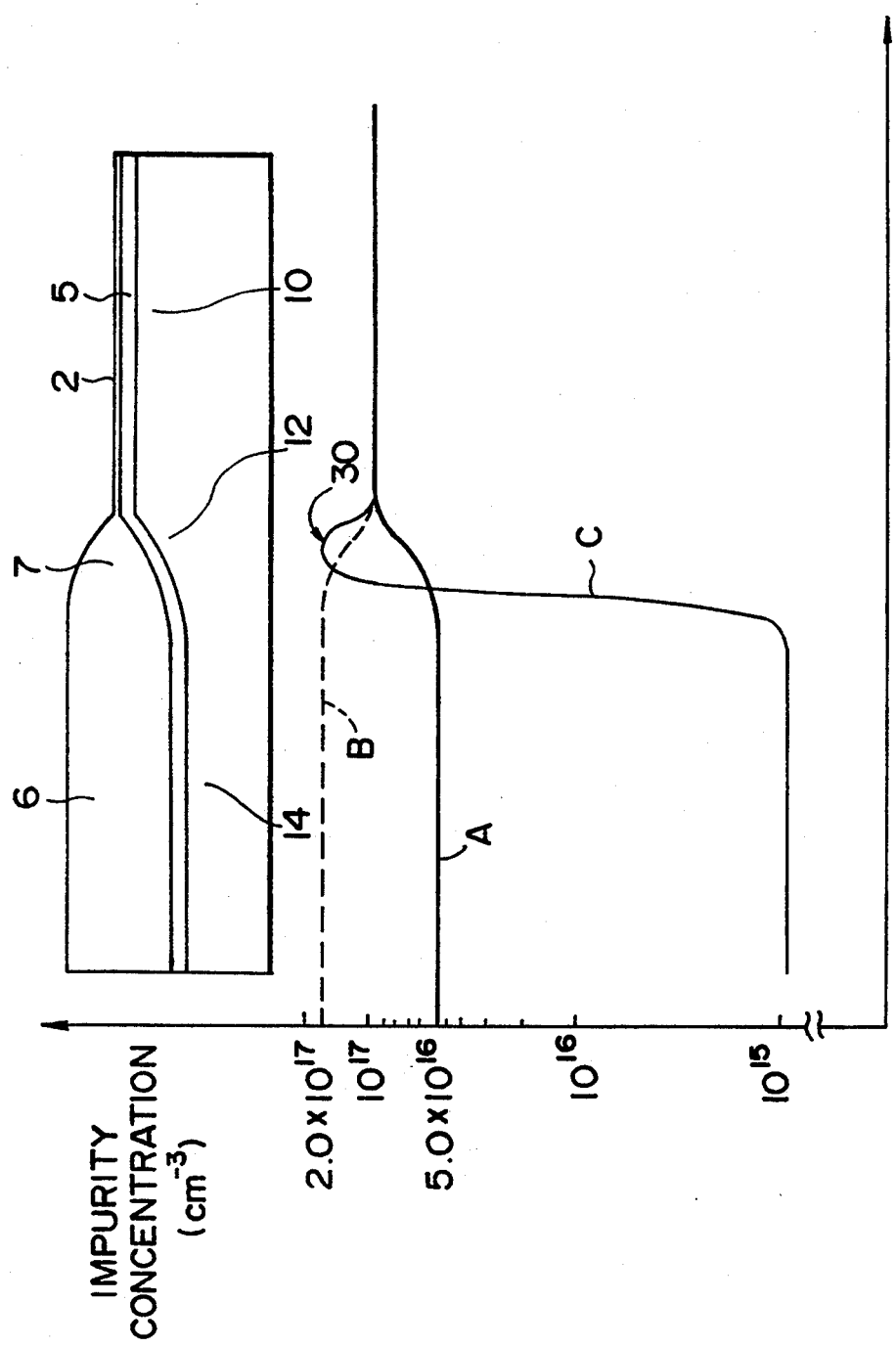
FIG. 6 is a graph comparing the profiles of the impurity concentration distribution of semiconductor devices for the present invention and the prior art in the regions of the devices ranging from the device region to the device isolation region.

This process is shown in FIG. 6. Here, line A shows the profile of the impurity concentration distribution for an example of this embodiment and line C shows the profile of the impurity concentration distribution of the selective oxidation for the conventional art.

As is shown in FIG. 6, the impurity concentration for each region of the line A is, for example, as follows; at the boundary between the device isolation layer 6 and the device isolation region 14: $5.0 \times 10^{16} (cm^{-3})$; underneath the bird's beak region 7: $8.0 \times 10^{16} (cm^{-3})$; and at the boundary between the oxidation layer 2 and the device region 10: $1.0 \times 10^{17} (cm^{-3})$. Regarding the line C, the impurity concentration at the boundary between the device isolation layer 6 and the device isolation region 14 is $1.0 \times 10^{15} (cm^{-3})$ which is low compared to the present embodiment, the concentration under the bird's beak region 7 shown as a peak 30 is $2.0 \times 10^{17} (cm^{-3})$ which is high compared to the present embodiment, and the concentration at the boundary between the oxidation layer 2 and the device region 10 is $1.0 \times 10^{17} (cm^{-3})$.

As shown in FIG. 6, according to the present embodiment, there are no imbalance created in the profile of the impurity concentration distribution for a border region 12. More particularly, there is no peak 30 formed in the profile of the impurity concentration distribution for the region underneath the bird's beak region 7. In addition to this, the profile of the impurity concentration distribution for the region ranging from the device isolation region 14 to the device region 10 changes continuously, and this change can be limited within a decade. It follows that during the formation of the device isolation layer 6 by thermal oxidation in step (e), impurities such as those under the bird's beak 7 do not project into the device region 10. As a result of this, the impurities are effectively prevented from doing bad influences such as an occurrence of narrow channel effects, a generation of a leakage current and a drop of a breakdown voltage on the device such as a transistor and an active region.

The profile of the impurity concentration distribution is not merely limited to that shown by the line A in FIG. 6, and the profile of the impurity concentration distribution such as that shown by the line B in FIG. 6, where the impurity concentration for the device isolation region 14 is higher than the impurity concentration for the device region 10, is also suitable.

The profile of the impurity concentration distribution at the device isolation region 14 for this embodiment is higher than that in the conventional art. The impurities 5 introduced into the device isolation region 14 act as a channel stopper to prevent an inversion region from occurring in the device isolation region 14. Consequently, in order to prevent a generation of an inversion region, it is very effective to increase the impurity concentration in the device isolation region more. So, according to the present embodiment, the impurity concentration in the device isolation region 14 can be made adequately high to prevent more effectively a generation of an inversion region as shown in FIG. 6. This means that the device element isolation region 14 can be made narrow while retaining adequate device isolation performance, meaning that fine pattern process is highly improved.

With regards to this, when using the method in the conventional art, there was an imbalance in the impurity concentration at the bird's beak region 7 described above. This meant that it is impossible to get an adequate impurity concentration in the device isolation region 14. Therefore, in order to maintain adequate device isolation performance it becomes necessary to increase the width of the device isolation region 14. This means that the pitch between the elements increases, and that several problems such as increase of the area of any memory, microprocessor and D.S.P. chips or the like and a low manufacturing yield arise.

(3) Reducing of the Bird's Beak Region

FIG. 2 is a cross-sectional view including the step (g) for reducing the bird's beak region 7 by, for example, wet etching of the entire body of the oxide layer after the step (f) shown in FIG. 1.

The reducing of the bird's beak region 7, which was impossible with the conventional art, is possible in this present embodiment. The reason for this is as follows.

Figure 2A:
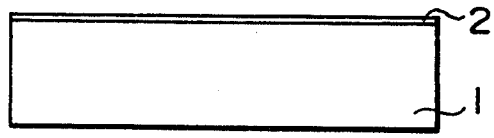
FIGS. 2a–2g are cross-sectional views showing, in addition to the processes of FIG. 1, step (g) for removing the bird's beak region in the same embodiment.
Figure 2B:
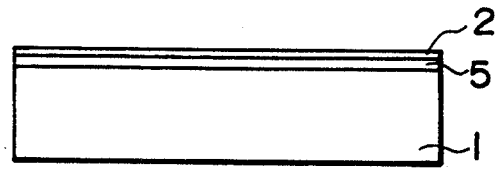
Figure 2C:
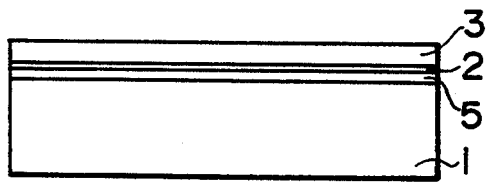
Figure 2D:
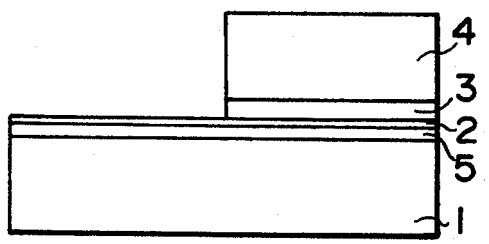
Figure 2E:
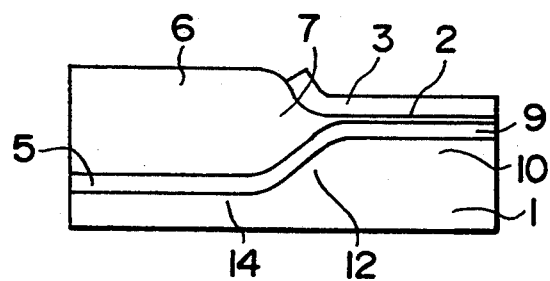
Figure 2F:
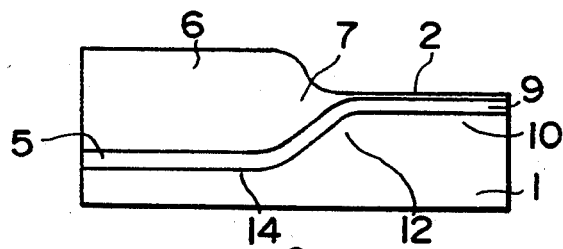
Figure 2G:
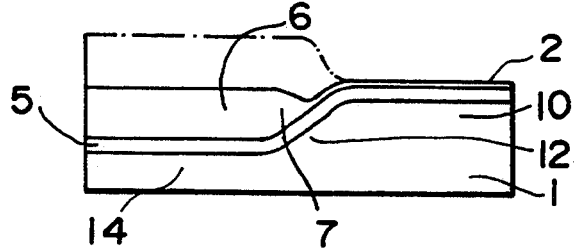
Figure 3A:
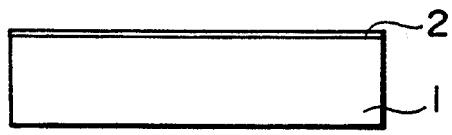
FIGS. 3a–3h are cross-sectional views showing, in addition to the processes of FIG. 2, step (h) for forming a gate in the same embodiment.
Figure 3B:
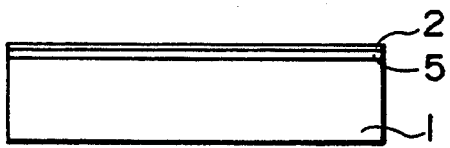
Figure 3C:
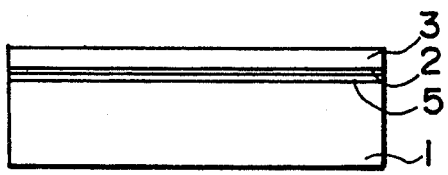
Figure 3D:
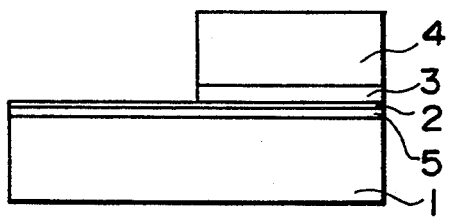
Figure 3E:
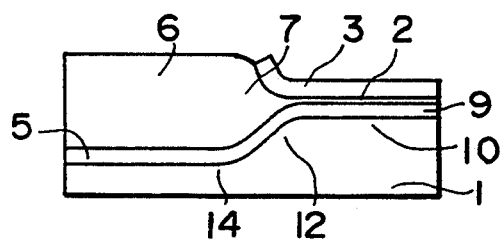
Figure 3F:
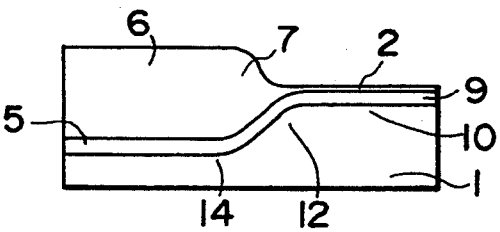
Figure 3G:
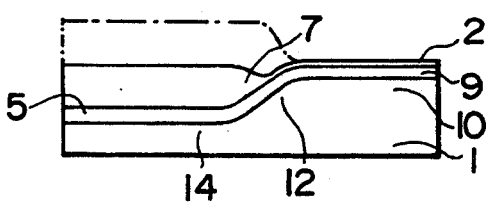
Figure 3H:
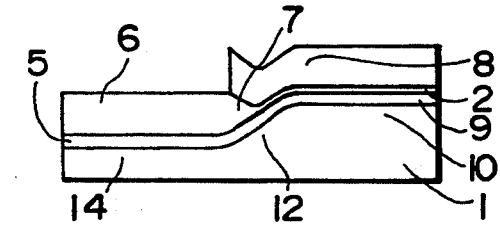

If the bird's beak region 7 is reducing, the region below the bird's beak region 7 becomes exposed as shown in FIG. 2g. As shown in FIG. 6, for the conventional art the region underneath the bird's beak region 7 is the region where the impurity concentration peak 30 has been formed. If the device region 10 is then used to form a transistor, the gate of this transistor will be formed on the exposed area of the peak 30 and this will cause bad influences such as stronger narrow channel effects on the characteristics of the transistor.

In this embodiment, impurities are introduced into a region ranging from the device region to the device isolation region. Therefore, even if the bird's beak region 7 is reduced, the impurity concentration at the exposed region is between that of the device isolation region 14 and that of the device region 10, and as such is barely different from that of the device region 10. As a result of this, even using a channel width of 0.15 $\mu$m, a practically useful transistor characteristics can be produced without any bad influences.

As shown above, in this embodiment, it is possible to reduce the bird's beak region 7 by a simple process. This has the following advantages when compared to the conventional art.

Firstly, the reducing of the bird's beak region 7 means that the fine pattern process can be much more improved.

Taking an 0.8 $\mu$m process as an example for the purposes of this explanation, with a pitch between elements of 1.6 $\mu$m, 1.0 $\mu$m in this pitch is for the device isolation width, and 0.6 $\mu$m is for the smallest element width. In the conventional art, 0.2 $\mu$m of the 1.0 $\mu$m allotted to the device isolation width is occupied by the bird's beak region 7.

According to this embodiment, upon reduction of the bird's beak region 7 by step (g), the width of the bird's beak region 7 can be reduced to, for example, 0.2 $\mu$m. This means that the pitch between elements which was 1.6 $\mu$m for a 0.8 $\mu$m process in the conventional art can now be reduced to 1.4 $\mu$m, thus improving the fine pattern process. Especially, as for DRAM, SRAM and DSP or the like, because the higher density of integration is needed, device elements are arranged that thus reduced pitch become the minimum pitch in general. It follows that by reducing the pitch between elements from 1.6 to 1.4 $\mu$m, the overall area of the body of integrated circuits made as a result would decrease by a factor of two, which would in turn result in a sharp reduction in costs and a higher yield.

Here, in order to make the bird's beak region 7 small, the thickness ratio of the anti-oxidation layer 3 to the thin oxidation layer 2 under the anti-oxidation layer 3 can be increased. However, with this method, the stress which is generated during a growth of the device isolation layer 6 often causes crystal defects in the substrate. Particularly, in the conventional art, when the bird's beak region 7 is reduced using unreasonable ratio of the thickness, there were problems whereby the process margins became too small.

However, according to this embodiment, strict attention to detail is not necessary at this point. For example, although in the above explanation the oxidation layer 2 had a thickness of 150 Angstroms and the anti-oxidation layer 3 had a thickness of 1800 Angstroms, corresponding values of 200 Angstroms and 1400 Angstroms can also be used. This means that even if the size of the bird's beak region 7 is increased by lowering the layer thickness ratio, by wet etching of the whole body of the oxidation layer according to this embodiment, the area of the bird's beak region 7 can be made the same as the case wherein the thickness of the oxidation layer is 150 Angstroms and the thickness of the anti-oxidation is 1800 Angstroms. In this case, because the layer thickness ratio of the oxidation layer 2 to the anti-oxidation layer 3 is kept small, there is no reduction in the process margin so again the process yield can be greatly increased.

(4) Element Region Formation

Figure 4A:
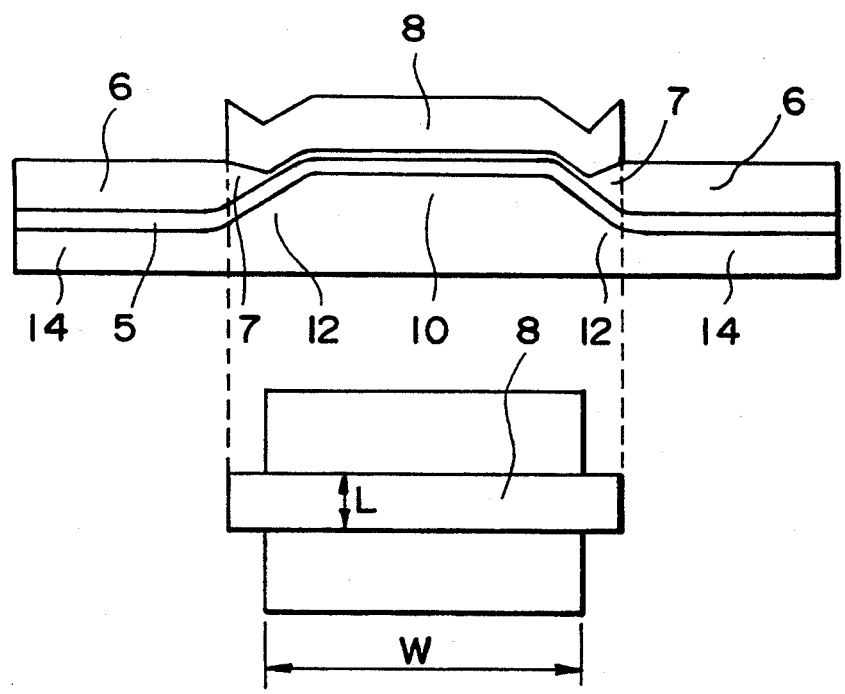
FIGS. 4A and 4B are fragmentary cross-sectional views showing the semiconductor device of the present invention.

After the step (g) shown in FIG. 2, a gate is formed on a device region to make a transistor region by the manufacturing step (h), a cross-sectional view of which is shown in FIG. 3, and the device construction of which is shown in FIG. 4a. In FIG. 3, the step (h) takes place after the step (g), but the step (g) can be omitted altogether to place the step (h) directly after the step (f) when reducing of the bird's beak region 7 is not needed.

The advantage of forming a transistor region or the like at the device region after the device isolation in the present embodiment are as follows.

The first advantage is that the impurities for the channel stopper which are introduced during the step (b) can also be used for as the channel doping to control the threshold voltage occurring in the transistor. So, the process which was necessary in the conventional art whereby impurities were introduced in order to control the threshold voltage occurring in the transistor region can be omitted. This means that the number of processes can be reduced by two at least, which in turn reduces the control cost and increases the product yield.

The second advantage is that, as mentioned previously, there is no irregular concentration of impurities in the area underneath the bird's beak region 7 in this embodiment, and thus these impurities do not diffuse into any transistor region during thermal oxidation or the like. In this way, a generation of narrow channel effects, that is, an increase of the threshold voltage brought about by a reduction of the width of a channel, can be controlled much better than the conventional art, as shown in FIG. 5. As a result, the width of the device isolation, which could be reduced only to 1 $\mu$m in the conventional art, can be successfully reduced to 0.3 $\mu$m.

In particular, in the conventional art, at the time of designing the device, the occurrence of narrow channel effects is a large consideration when deciding the width of the device. For example, in LSI or ULSI such as DRAM, SRAM or DSP it is intended that the area of the whole device should be reduced by reducing the area of the individual elements. This means that the transistor width W will be set to the minimum possible value. However, as shown in FIG. 5, if the transistor width W becomes 1.0 $\mu$m or less, the threshold voltage will start to increase, so the transistor width W could not be reduced substantially below 1.0 $\mu$m. There is therefore a problem that even if the transistor channel length denoted by L in FIG. 4B could be finely tuned to less than 0.6 $\mu$m, the fact that the value of W is greatly restricted by narrow channel effects means that the element size cannot be substantially reduced.

With regards to this, according to the present embodiment, the transistor width W can now be formed to a width of 0.3 $\mu$m, as shown in FIG. 5. This means that the design margins can now be made much larger as the narrow channel effects which depended on these fluctuations in W need little consideration.

Moreover, even if the value of W falls 1.0 $\mu$m or less, the characteristic curve of the threshold voltage shown in FIG. 5 is almost flat. This means that even if the size of W fluctuates due to process variations, the fluctuations in the threshold voltage can be kept small. This will greatly improve the process margin as well as providing substantial improvements in the product yield and the like.

In this way the present invention does not only reduce the number of steps in the process by at least two steps, it also improves narrow channel characteristics of the transistors much more better than the conventional art.

Figure 4B:
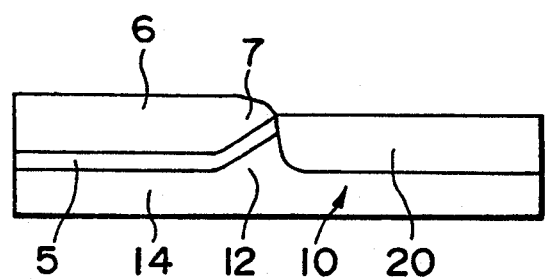

The device formed at device regions in the present embodiment is not simply limited to the kind of transistor described above, and an active region 20 made of impurities of an opposite polarity to that of a substrate 1 is also possible as shown in FIG. 4B.

As shown in FIG. 4B, there are the following problems in the conventional art when a device region 10 is an active region 20. If the impurity concentration distribution in the border region 12 is imbalance, the breakdown voltage in this region will become low. Also, if impurities of another polarity diffuse into the active region 20, the leakage current in this region will increase.

As the present embodiment does not have the problems described above because there is no imbalance in the impurity concentration distribution in the border region 12 and no diffusion of impurities into the active region 20, so a process yield and device reliability can be exceedingly improved compared with the conventional art.

(5) Control of the Profile of Impurity Concentration

In the present embodiment, the most preferable profile of the impurity concentration distribution for the device region 10 and the device isolation region 14 should be controlled by increasing the implant energy for the impurities 5 in step (b) in accordance with the thickness of the device isolation layer 6 which is formed in the step (e). This is explained as follows.

In order to increase the device isolation performance of the device isolation region 14, it is necessary to increase the parasitic threshold voltage in the device isolation region 14 by either making the concentration of impurities in the device isolation region 14 high or making the device isolation layer 6 thick.

However, if the thickness of the device isolation layer 6 is increased, a larger amount of the impurities 5 are absorbed by the device isolation layer 6 during a formation of the device layer 6 by thermal oxidation. This in turn lowers the impurity concentration in the device isolation region 14. As a result, any increases in the device isolation performance of the device isolation region 14 which may have been made by increasing the thickness of the device isolation layer 6 is canceled.

Figure 7A:
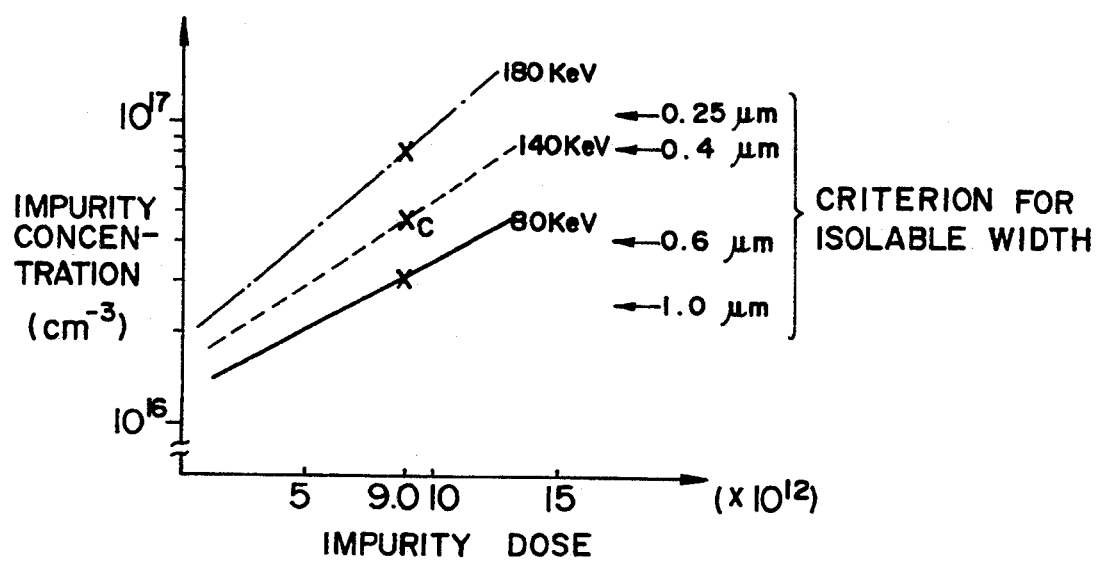
FIG. 7A is a graph showing the relationship between the quantity of the impurity dose applied and the impurity concentration appearing within the device isolation region.
Figure 7B:
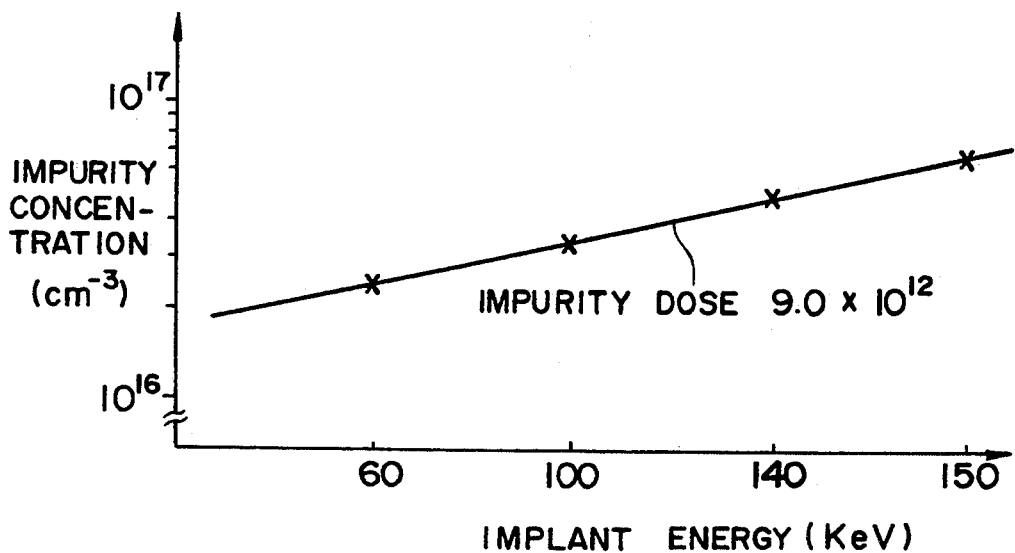
FIG. 7B is a graph showing the relationship between the impurity implant energy applied and the impurity concentration appearing within the device isolation region.

In the present embodiment, this problem can be settled by increasing the impurity dose or increasing the impurity implant energy. This is shown in FIG. 7. FIG. 7A shows the relationship among the impurity implant energy, the impurity dose and the impurity concentration in the device isolation region 14. FIG. 7B shows the relationship between the impurity concentration and the impurity implant energy for a fixed impurity dose of $9.0 \times 10^{12}$. As shown in FIGS. 7A and 7B, an increase in the impurity dose or an increase in the impurity implant energy will produce an increase in the impurity concentration in the device isolation region 14.

The reason the impurity concentration in the device isolation region 14 increases when the impurity implant energy is increased is as follows. If the impurity implant energy is increased, the peak in the profile of the impurity concentration distribution will be placed at a greater depth. Because of this, when the device isolation layer 6 is formed by thermal oxidation, it is possible to decrease the amount of the impurities absorbed into the device isolation layer 6 and to increase the impurity concentration in the device isolation region 14. This is shown in FIG. 9. In FIG. 9, the profile of the impurity distribution with respect to depth within the semiconductor substrate 1 while varying the implant energy at a fixed impurity dose of $9 \times 10^{12}$ is shown. FIG. 9 also shows that an implant energy of 140 KeV causes a greater increase in the impurity concentration in the device isolation region 14 than the implant energy of 80 KeV, and thus also creates greater device isolation performance.

Figure 10:
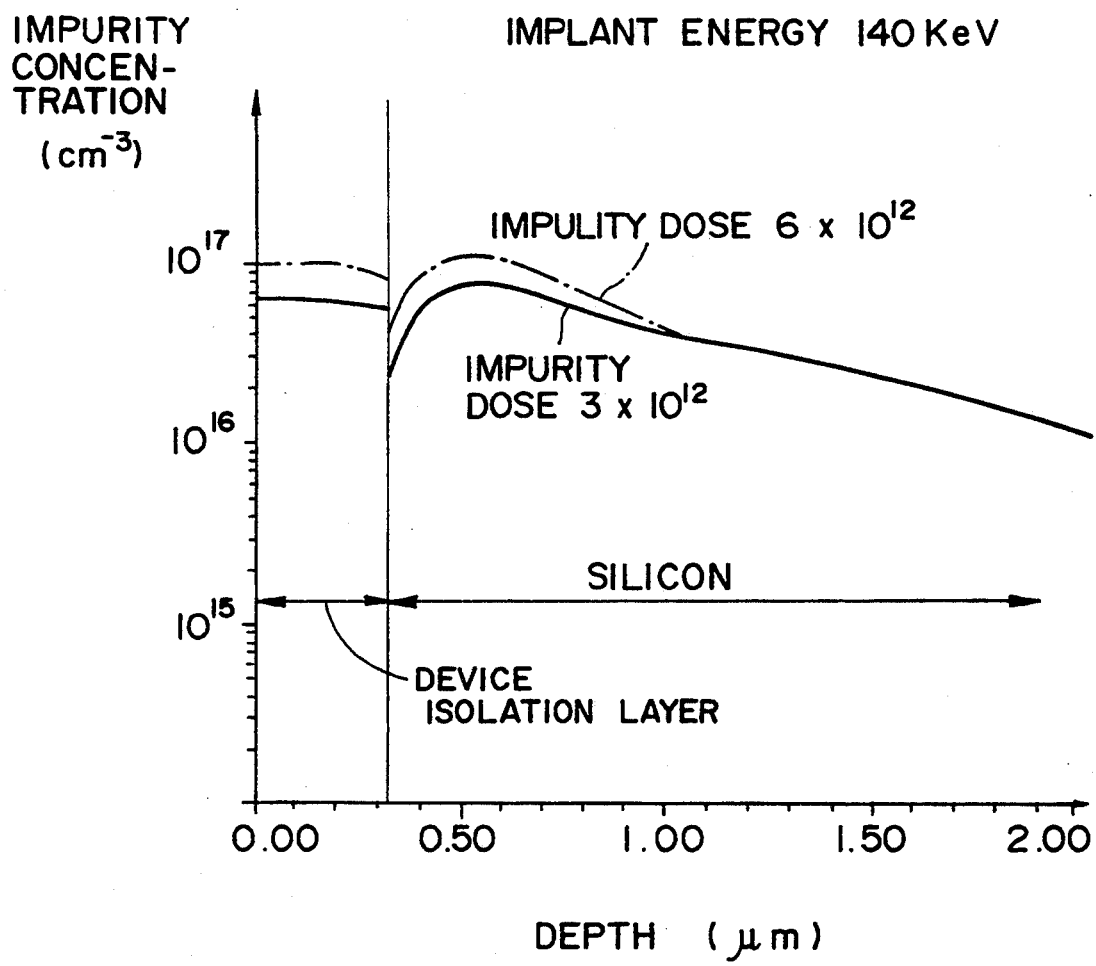
FIG. 10 is a characteristic curve showing the variation of the profile of the impurity concentration distribution in the direction of the depth of the substrate as the quantity of the impurity dose is varied.
Figure 13A:
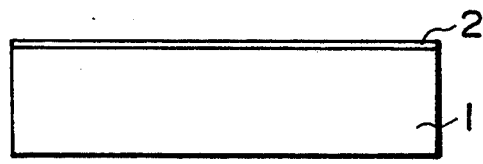
FIGS. 13a–13g are cross-sectional views showing the selective oxidation of the conventional art.
Figure 13B:
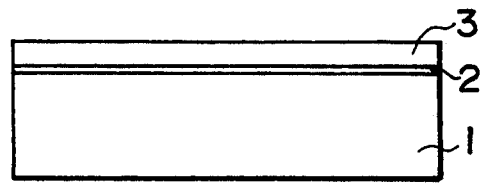
Figure 13C:
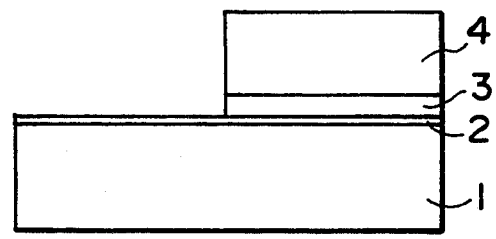
Figure 13D:
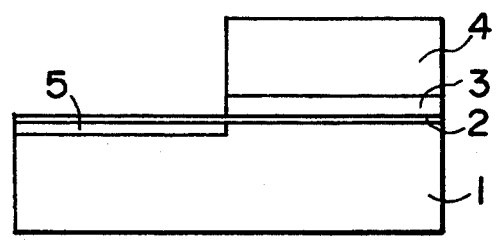
Figure 13E:
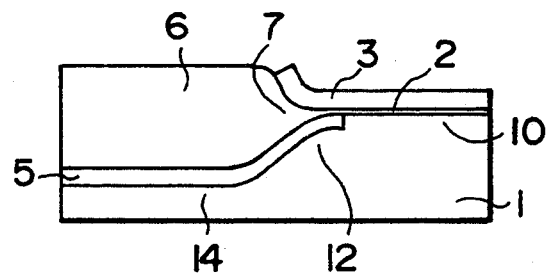
Figure 13F:
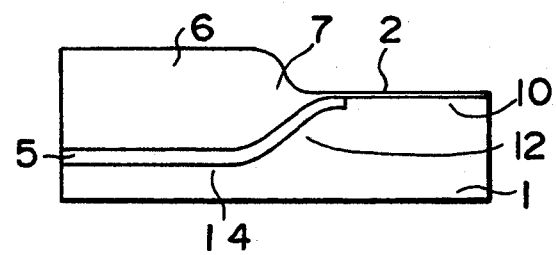
Figure 13G:
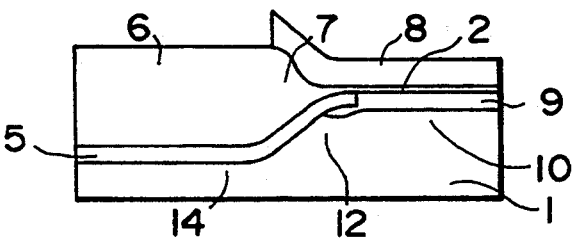

FIG. 10, on the other hand, shows the profile of the impurity concentration distribution with respect to depth within the semiconductor substrate 1 while varying the impurity dose, for a fixed implant energy of 140 KeV. FIG. 10 also shows that a impurity dose of $6 \times 10^{12}$ causes a greater increase in the impurity concentration in the device isolation region 14 than a impurity dose of $3 \times 10^{12}$, and thus also creates greater isolation performance.

In this way, in this present embodiment, both the impurity implant energy and the impurity dose can be used to control the profile of the impurity concentration distribution at the device isolation region 14. For example, as shown in FIG. 7(A), for a fixed dose of $9.0 \times 10^{12}$, an implant energy of 80 KeV will give a device isolation of within 1 $\mu$m, an implant energy of 140 KeV will give a device isolation of within 0.6 $\mu$m and an implant energy of 180 KeV will give a device isolation of within 0.4 $\mu$m.

As there are quantitative restrictions to the impurity dose and impurity implant energy in the method used in the conventional art, the control of the profile of the impurity concentration distribution by the dose and implant energy is very difficult.

In the conventional art, if the dose is increased to increase the device isolation performance, the imbalance in the profile of the impurity concentration destribution C shown in FIG. 6 becomes more noticeable. Therefore, to make impurity concentration at the boundary between the device isolation region 14 and the device isolation layer 6 greater than $1 \times 10^{16} (cm^{-3})$ is substantially difficult because the deterioration of the device characteristics such as narrow channel effects is caused by impurities diffusion into the device region 10. It is therefore difficult in the conventional art to control the profile of the impurity concentration distribution in the device isolation region 14 by increasing the dose.

To this regard, as mentioned above, in the present embodiment, the impurities are introduced into a region ranging from the device region 10 to the device isolation region 14, so there are no imbalances in the profile of the impurity concentration distribution in the device isolation border region 12. As a result of this, even if the impurity dose is increased, there is not negative effect on the device characteristics because the impurities do not diffuse into the device region 10. It is therefore now possible to control the profile of the impurity concentration distribution by impurity dose. This means that it is also possible to have an impurity concentration at the boundary between the device isolation region 14 and the device isolation layer 6 which is greater than $1 \times 10^{16} (cm^{-3})$. It is therefore also possible to increase the device isolation performance greatly in order to increase the device isolation performance. An impurity concentration of greater than $5 \times 10^{16} (cm^{-3})$ is preferable for the finer pattern process.

A problem which makes the control by the impurity implant energy very difficult in the conventional art is as follows. In the conventional art, the impurities as a channel stopper is masked by the anti-oxidation layer 3 to prevent from being diffused into the device region 10. However, if the implant energy is made high, for example, greater than 40 KeV, impurities 5 break through the anti-oxidation layer 3.

In this respect, in the present embodiment, this problem does not occur because the impurities 5 are introduced before the formation of the anti-oxidation layer 3. So, it is now possible to control the profile of impurity concentration distribution using implant energies of 40 KeV or more, unlike in the conventional art. Implant energies of 80 KeV or more are preferred to increase the device isolation performance and thus improve the fine pattern process.

Figure 8A:
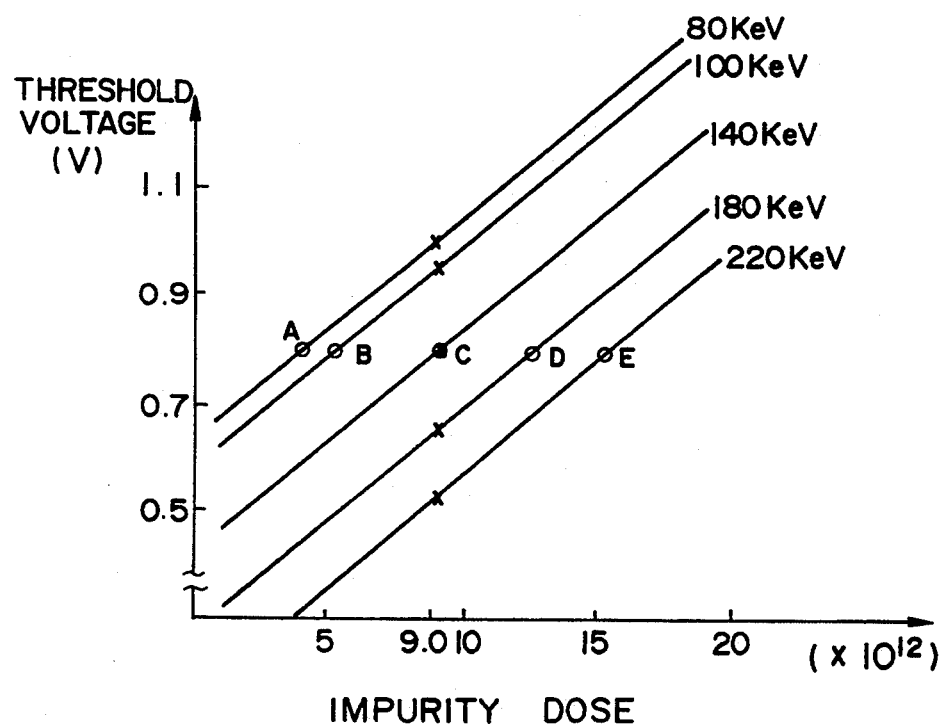
FIG. 8A is a graph showing the relationship between the quantity of the impurity dose and the threshold voltage.
Figure 8B:
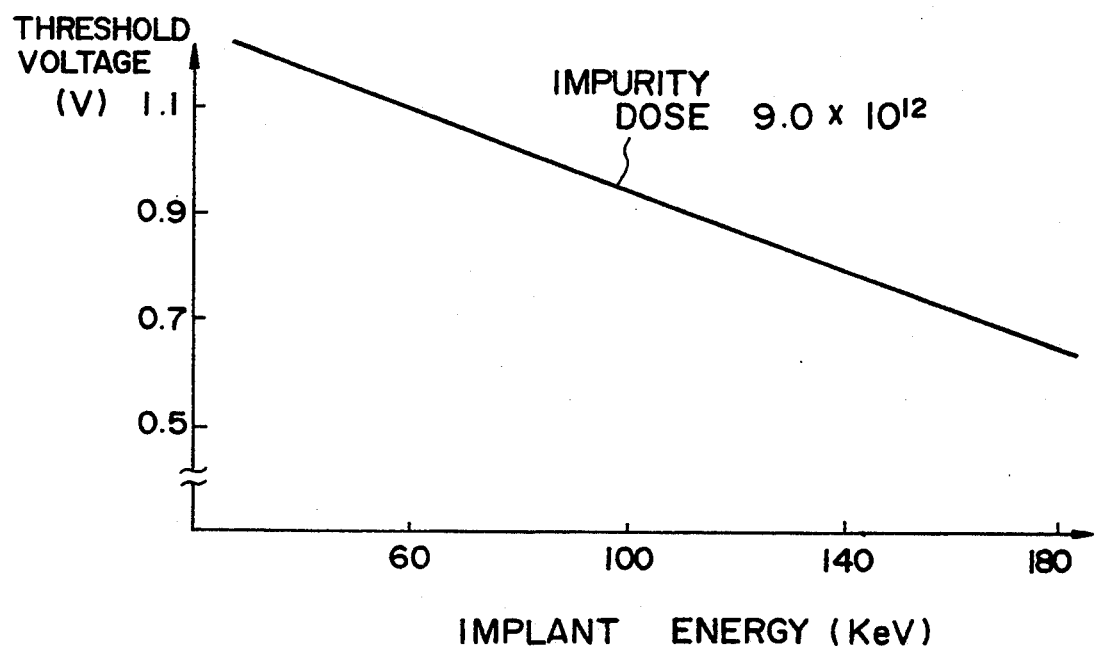
FIG. 8B is a graph showing the relationship between the impurity implant energy and the threshold voltage.

In this way, the process of increasing the device isolation performance by controlling the profile of the impurity concentration distribution using the implant energy and impurity dose, which is difficult in the method used in the conventional art, is now possible. Also, in the present embodiment, the profile of the impurity concentration distribution in the device region 10 can also be controlled at the same time as controlling that in the device isolation region 14. This is shown in FIG. 8. In FIG. 8A, the relationship among the impurity implant energy, the impurity dose and the transistor threshold voltage for the device region 10 is shown. In FIG. 8B, the relationship between the threshold voltage and the impurity implant energy for a fixed impurity dose of $9.0 \times 10^{12}$ is shown. As is shown in FIGS. 8A and 8B, the threshold voltage for the device region 10 is reduced as the impurity dose is decreased and the impurity implant energy is increased.

Here, if the impurity implant energy is increased, the profile peak of the impurity concentration distribution is placed at a greater depth. This reduces the impurity concentration at the boundary between the device region 10 and the oxidation layer 2, and thus the threshold voltage is also reduced. In this way, in the device region 10, as the oxidation layer 2 absorbs fewer impurities due to its being thinner than the device isolation layer 6, a characteristic which is the reverse of that of the device isolation region 14 can be presented. It follows that in the present embodiment, by making the implant energy high, the impurity concentration occurring in the device isolation region 14 can also be made high, and thus the device isolation performance can also be improved. On the other hand, regarding the device region 10, by making the implant energy high, the transistor threshold voltage can also be reduced, and the performance of the transistor can thus be improved. In this case, the higher the implant energy, the more the foot portion of the profile of the impurity concentration distribution with respect to depth within the semiconductor substrate can be used as the inverted region of the transistor. It follows that by making the implant energy high, fluctuations in the process for setting the transistor threshold voltage occurring in the device region 10 can be reduced, thus increasing the product yield.

This is very effective when dealing with process for low voltage operating device. In this case, it is necessary to set a threshold voltage at 0.6 v or less which is usually set at about 0.8 v and control it. However, if the fluctuation of the threshold voltage by process fluctuation is +/−0.2 v or more, the reduction of the threshold voltage causes the noise margin below 0.4 v or less. This creates the problem that the design margin is greatly reduced. As the threshold voltage adjustment in the conventional art is controlled via the impurity doping for the channel doping, the control of fluctuations in the threshold voltage caused by process fluctuation is very difficult.

In the present embodiment, the threshold voltage for low voltage processes can be controlled by controling the implant energy. By making the implant energy high, as shown in FIG. 8B, the threshold voltage can be lowered, and the foot of the profile of the impurity concentration distribution can be used as the inverted region of the transistor. By doing this, even if the threshold voltage is made low, the fluctuations in the threshold voltage induced by process fluctuations can also be kept low, which is most preferable in the case of the process for low voltage operating device.

The processes whereby the threshold voltage is controlled by making the implant energy high are not simply limited to the kind of process described above. It is also possible to apply this method of control to the formation of high performance transistors with a threshold voltage of, for example, 0.6 v or less.

The following is a description of the design of the process for this embodiment.

The design of the process has the following procedure. Firstly, the threshold voltage Vth for the transistor to be used in this process is decided. Then, after a value of, for example, Vth=0.8 v is selected, suitable values for the combination of the impurity dose and implant energy are selected. The combination is selected from the points A,B,C,D and E shown in FIG. 8A. By considering device characteristics such as the device isolation performance, and the performance of the device for implantation of the impurities or the like, a suitable combination can be decided upon.

The following is an explanation citing this as an example. If an implant energy of 140 KeV is taken to be the most suitable in consideration of the implant energy of the device, then the combination indicated by the point C in FIG. 8A is selected. Next, a corresponding impurity dose value of $9.0 \times 10^{12}$ will be read from the graph. Then, with reference to FIG. 7A, from this implant energy of 140 KeV and dose of $9 \times 10^{12}$, we can deduce the corresponding impurity concentration to occur in the device isolation region 14. Next, the possible device isolation width is decided taking into account other device parameters such as the thickness of the device isolation layer 6 and the impurity concentration. Then, if this device isolation width is deemed suitable taking into account the process parameters, the point C will be selected.

Lastly, as described above, if the implant energy and the device isolation performance are both made high, there will be less process fluctuation in the threshold voltage produced in the device region 10. So as long as the conditions of the device are also subject to limitations, it is preferable to set the implant energy high.

Second Embodiment

FIG. 11 shows a second embodiment of the present invention. In this second embodiment, there is an additional step (b2), whereby a polysilicon layer 50 is formed, between step (b) and step (c) shown in FIG. 1 of the first embodiment. In this way, as is shown in FIG. 11d, a device which has a polysilicon layer 50 sandwiched between the oxidation layer 2 and the anti-oxidation layer 3 can be produced.

According to this second embodiment, having a polysilicon layer 50 sandwiched between the oxidation layer 2 and the anti-oxidation layer 3 brings about the following benefits.

The ratio between the thickness of the anti-oxidation layer 3 to the oxidation layer 2 is made sufficiently high enough to reduce the size of the area that the bird's beak region 7 occupies upon formation of the device isolation layer 6 after the step (d), as described previously. However, in using this method, the stress by the growth of the device isolation layer 6 can cause crystal defects within the body of the semiconductor substrate. The conventional art, in particular, has a problem whereby the process margin becomes extremely small due to the practically impossible thickness ratio for reduction of the size of the bird's beak region 7.

Therefore, according to this second embodiment, an element construction whereby a polysilicon layer 50 is sandwiched between the oxidation layer 2 and the anti-oxidation layer 3 has been selected in order to avoid the generation of stress which induces crystal defects. By using this kind of construction, a part of the stress on the semiconductor substrate 1 by the formation of the device isolation layer 6 by thermal oxidation can be instead turned to the polysilicon layer 50. It follows that as the stress on the semiconductor substrate 1 can be reduced to half of that for the conventional art, the crystal defects in the semiconductor substrate 1 have effectively been prevented. The region that the bird's beak region 7 occupies can therefore be greatly reduced as the anti-oxidation layer 3 can now be made thick so that the high thickness ratio which was impossible to attain in the conventional art is now a possibility. Accordingly, in this embodiment, taking into account the additional process of the reducing of the bird's beak region 7 which takes place after the formation of the device isolation layer 6, the area the bird's beak region 7 occupies can be further reduced. This gives a device which, when comparing its product yield and reliability to that of the conventional art, proves to be far superior.

For example, when a layer thickness for the anti-oxidation layer 3 is greater than 2000 Angstroms and a layer thickness for the oxidation layer 2 is less that 200 Angstroms, a polysilicon layer formed to a layer thickness of less than 200 Angstroms would be preferable for this second embodiment.

Third Embodiment

FIG. 12 shows a third embodiment of the present invention. This third embodiment differs from the first embodiment in that the impurities 5 are introduced in the step (a). Next, the anti-oxidation layer 3 is formed directly on top of the semiconductor substrate 1 in the step (b). After this, an oxidation layer 52 is formed on top of this anti-oxidation 3 by the step (c), with a further anti-oxidation layer 3 being formed on this oxidation layer 52 by the step (c2). The manufacturing process after (c2) is the same as that for the first embodiment.

According to the above processes, as shown in FIG. 12(e), a device can be attained whereby an oxidation layer 52 is sandwiched between double anti-oxidation layers 3, with the anti-oxidation layers being formed directly onto the semiconductor substrate 1.

This way of forming an anti-oxidation layers 3, 3 having an oxidation layer 52 sandwiched between them directly onto a semiconductor substrate 1 has the following advantages.

Firstly, in this third embodiment, by forming the anti-oxidation layer 3 directly on top of the semiconductor substrate 1, the generation of the bird's beak region 7 can be effectively prevented. However, the stress of the anti-oxidation layer 3 influences directly on the semiconductor substrate 1. Accordingly, in this third embodiment, by sandwiching a oxidation layer 52 between the anti-oxidation layers 3, it is possible to turn the most of the stress on the anti-oxidation layers 3 effectively to the oxidation layer 52. In this way, crystal defects within the semiconductor substrate 1 can also be effectively avoided. Accordingly, in this embodiment, taking into account the additional process of the reducing of the bird's beak region 7 which takes place after the formation of the device isolation layer 6, the area the bird's beak region 7 occupies can be significantly reduced. This gives a device which, when comparing its product yield and reliability to that of the conventional art, proves to be far superior.

It should be noted that the present invention is not limited to the embodiment described above and that an assortment of embodiment variations within the scope of this invention are also possible.

An example of a selective oxidation method suitable for this invention is shown in embodiments 1, 2 and 3 but this invention can be also applied to all other methods as long as they use a selective oxidation.

Lastly, the semiconductor process for the present invention is not simply limited to a CMOS process, and various other suitable processes such as NMOS, PMOS, BICMOS or the like are also possible.

What is claimed is:

1. A method of manufacturing a MOS-FET semiconductor device having a device isolation layer formed on a semiconductor substrate isolating a device region from a device isolation region, said method comprising the steps of:
    (a) forming an oxidation layer on the semiconductor substrate having a predetermined conductivity;
    (b) after step a, introducing impurities having the same conductivity as the semiconductor substrate into the semiconductor substrate, said impurities forming a channel stopper in the device isolation region and controlling a threshold voltage of the MOS-FET device in the device region;
    (c) after step b, forming an anti-oxidation layer on said oxidation layer;
    (d) after step c, removing an arbitrary portion of said anti-oxidation layer;
    (e) after step d, thermally oxidizing the semiconductor substrate to grow a portion of said oxidation layer from which the anti-oxidation layer was removed in step d, to form the device isolation layer;
    (f) after step e, removing said anti-oxidation layer; and
    (g) after step f, providing a gate electrode in the device region to form a MOS-FET transistor region, wherein performing step (b) prior to step (c) assures that no peak in a concentration profile of said impurities is formed in the border region between said device region and said device isolation region, thereby preventing the impurities from diffusing into said transistor region and avoiding a narrow channel effect in the MOS-FET device.

2. A semiconductor device manufacturing method according to claim 1, further comprising the step of reducing a bird's beak region at an end of said device isolation layer between said anti-oxidation layer removing step (f) and said gate electrode providing step (g), wherein no peak is formed in a concentration profile of the impurities below the bird's beak, such that a narrow channel effect in the MOS-FET device is prevented when the gate electrode is formed below the bird's beak.

3. A semiconductor device manufacturing method according to claim 1, wherein the impurity implant energy used in said impurity introducing step is at least 40 KeV.

4. A semiconductor device manufacturing method according to claim 1, further comprising the step of controlling an impurity implant energy used in said impurity introducing step (b), to assure the effectiveness of the channel stopper, the impurity implant energy increasing as the thickness of said device isolation layer is increased to prevent excess absorption of said impurities into said device isolation layer.

5. A semiconductor device manufacturing method according to claim 2, further comprising the step of controlling an impurity implant energy used in said impurity introducing step (b), to assure the effectiveness of the channel stopper, the impurity implant energy increasing as the thickness of said device isolation layer is increased to prevent excess absorption of said impurities into said device isolation layer.

6. A semiconductor device manufacturing method according to claim 1, wherein a step of forming a polysilicon layer is inserted between said impurity implant step (b) and said anti-oxidation layer forming step (c).

7. A semiconductor device manufacturing method according to claim 2, wherein a step of forming a polysilicon layer is inserted between said impurity implant step (b) and said anti-oxidation layer forming step (c).

8. A semiconductor device manufacturing method according to claim 6, wherein an impurity implant energy used in said impurity introducing step (c) is at least 40 KeV.

9. A method of manufacturing a MOS-FET semiconductor device having a device isolation layer formed on a semiconductor substrate isolating a device region from a device isolation region, said method comprising the steps of:
    (a) introducing impurities having the same conductivity as the semiconductor substrate into the semiconductor substrate, said impurities acting as a channel stopper in the device isolation region and controlling a threshold voltage of the MOS-FET semiconductor device in the device region;
    (b) after step (a), forming a first anti-oxidation layer on the semiconductor substrate;
    (c) after step (b), forming an oxidation layer on said first anti-oxidation layer;

(d) after step (c), forming a second anti-oxidation layer on said oxidation layer;
(e) after step (d), removing an arbitrary portion of each of said first and second anti-oxidation layers formed to sandwich said oxidation layer;
(f) after step (e), forming the device isolation layer by thermally oxidizing the semiconductor substrate;
(g) after step (f), removing said first and second anti-oxidation layers formed to sandwich said oxidation layer; and
(h) after step (g), providing a gate electrode in the device region to form a MOS-FET transistor region, wherein performing step (a) prior to steps (b), (c) and (d) assures that no peak in a concentration profile of said impurities is formed in a border region between said device region and said device isolation region, thereby preventing the impurities from diffusing into said transistor region and avoiding a narrow channel effect in the MOS-FET device.

10. A semiconductor device manufacturing method according to claim 9, further comprising the step of reducing a bird's beak region at an end of said device isolation layer between the step (g) of removing said first and second anti-oxidation layers formed to sandwich said oxidation layer and the step (h) of providing a gate electrode, wherein no peak is formed in a concentration profile of the impurities below the bird's beak, and a narrow channel effect in the MOS-FET device is prevented when the gate electrode is formed below the bird's beak.

11. A semiconductor device manufacturing method according to claim 10, further comprising the step of controlling an impurity implant energy used in said impurity introducing step (a), to assure the effectiveness of the channel stopper, the impurity implant energy increasing as the thickness of said device isolation layer is increased to prevent excess absorption of said impurities into said device isolation layer.

12. A semiconductor device manufacturing method according to claim 9, wherein the impurity implant energy used in said impurity introducing step is at least 40 KeV or more.

13. A semiconductor device manufacturing method according to claim 1, wherein an impurity implant energy used in said impurity introducing step is at least 80 kev.

14. A semiconductor device manufacturing method according to claim 2, wherein an impurity implant energy used in said impurity introducing step is at least 80 kev.

15. A semiconductor device manufacturing method according to claim 4, wherein an impurity implant energy used in said impurity introducing step is at least 80 kev.

16. A semiconductor device manufacturing method according to claim 5, wherein an impurity implant energy used in said impurity introducing step is at least 80 kev.

17. A semiconductor device manufacturing method according to claim 6, wherein an impurity implant energy used in said impurity introducing step is at least 80 kev.

18. A semiconductor device manufacturing method according to claim 9, wherein an impurity implant energy used in said impurity introducing step is at least 80 kev.

* * * * *